United States Patent [19]
Davari et al.

[11] Patent Number: 4,569,728
[45] Date of Patent: Feb. 11, 1986

[54] SELECTIVE ANODIC OXIDATION OF SEMICONDUCTORS FOR PATTERN GENERATION

[75] Inventors: Bijan Davari, Peekskill; Pankaj K. Das, Latham, both of N.Y.

[73] Assignee: The United States of America as represented by the Secretary of the Air Force, Washington, D.C.

[21] Appl. No.: 667,306

[22] Filed: Nov. 1, 1984

[51] Int. Cl.$^4$ .................. C25D 11/02; C25D 17/00
[52] U.S. Cl. ........................... 204/15; 204/224 R; 204/DIG. 7
[58] Field of Search ............... 204/15, 224 R, DIG. 7

[56] References Cited

U.S. PATENT DOCUMENTS

| | | | |
|---|---|---|---|
| 3,345,274 | 10/1967 | Schmidt | 204/15 |
| 3,890,215 | 6/1975 | DiLorenzo et al. | 204/129.2 |
| 4,133,724 | 1/1979 | Hartnagel et al. | 204/38 A |
| 4,217,183 | 8/1980 | Melcher et al. | 204/15 |
| 4,251,327 | 2/1981 | Grenon | 204/15 |

Primary Examiner—T. M. Tufariello
Attorney, Agent, or Firm—Donald J. Singer; Jacob N. Erlich

[57] ABSTRACT

Apparatus and method for selectively controlling anodic oxide growth on semiconductors for controlled electrochemical pattern generation incorporating use of a writing beam of a wavelength which encourages oxide growth and a bias beam at a wavelength which discourages oxide growth. The bias beam is projected on the semiconductor in electrolytic environment to prevent or retard oxide growth while oxide growth is accelerated at points of illumination by means of writing beam.

16 Claims, 13 Drawing Figures

SELECTIVE ANODIC OXIDATION OF SEMICONDUCTORS FOR PATTERN GENERATION

STATEMENT OF GOVERNMENT INTEREST

The invention described herein may be manufactured and used by or for the Government for governmental purposes without the payment of any royalty thereon.

BACKGROUND OF THE INVENTION

The present invention relates to GaAs integrated circuit technology, and in particular, to a novel means of controlling oxidation growth rate on anodically oxidized GaAs samples.

In U.S. Pat. No. 3,345,274 a method of making oxide film patterns on silicone semiconductor samples is disclosed where visible, near infra-red or infra-red light is projected onto the semiconductor substrate and functions to provide minority carriers so that anodic oxide formations can occur. Furthermore, application of such light for rear surface illumination in addition to application of a retarding blue light (about 4500° A) for front surface illumination is disclosed in that patent for production of oxide patterns on a silicone semiconductor sample under DC-bias by means of an electrochemical process.

However, such patent does not teach a controlled process for electrochemical oxide growth where both accelerating and retarding illumination beams are employed on the same working surface of a GaAs semiconductor sample to produce a defined oxide growth pattern. As well, no technique for use of a masked accelerating beam is disclosed or taught in such prior art.

SUMMARY OF THE INVENTION

It is therefore an object of the present invention to provide improved means for controlling the oxide growth rate of anodically oxidized GaAs samples.

It is another object of the present invention to employ a writing beam to accelerate oxide growth and a bias beam to retard oxide growth on a given surface of a semiconductor in an electrochemical process.

In the present invention, preferably GaAs samples (Cr doped) are anodically oxidized. The oxidation is preferably performed under 0.1-3 mA/cm² constant current densities. The interface band structure of the oxidized samples is compared to the unoxidized sample using two-beam TAV spectroscopy. This method monitors DC surface photoconductivity nondestructively. A band of acceptor levels centered around 1 eV above the valence band ($E_{A2}$) is detected. It is shown that the density of these levels is higher for the oxidized samples as compared to the unoxidized GaAs. The samples oxidized at higher current density exhibit a greater density of states. The GSCH model of the interface states for III-V compounds is applicable to describe the presence of this band at the unoxidized GaAs surface. The increase of the interface state density for the oxidized samples can be attributed to a layer of amorphous, nonstochrometric GaAs and $Ga_2O_3As_2O_3$ formed at the GaAs/oxide interface. The oxidation current density affects the crystal structure and the composition of this intermediate layer, and therefore the interface electrical properties. A band of donor levels around 1.3 eV below the conduction band might also be present at the GaAs/oxide interface only. Furthermore, a writing beam with bias beam arrangement is disclosed which selectively controls oxide growth in anodically oxidized samples. As well, use of a mask for pattern generation is disclosed where the mask is interposed between the writing beam source and the sample surface to be oxidized.

BRIEF DESCRIPTION OF THE DRAWINGS

The invention will be more clearly understood by reference to the following detailed description of a preferred embodiment thereof in conjunction with the accompanying drawings, in which.

DETAILED DESCRIPTION OF THE PREFERRED EMBODIMENT

Figure 1:
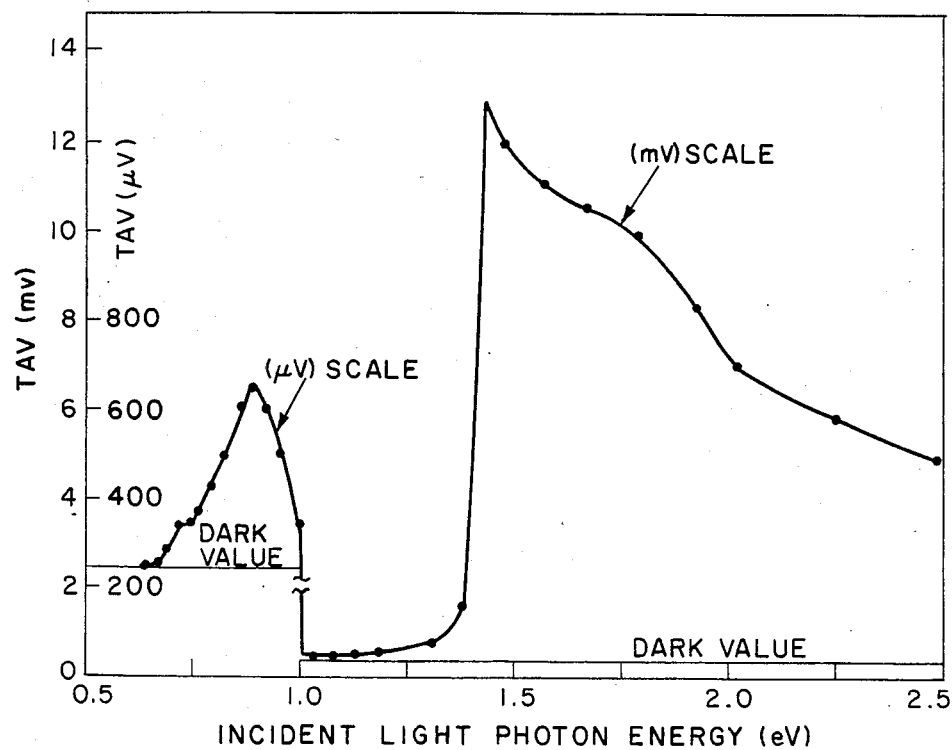
FIG. 1 shows a one-beam TAV spectrum obtained for unoxidized high-resistivity (Cr doped) GaAs samples, with incident beam photon flux equal to $7 \times 10^{14}/cm^2s$ with incident beam energy circa 0.6–2.5 eV.

In practice of the present invention, two-beam spectroscopy of the transverse acoustoelectric voltage (TAV) was used to reveal the surface band structure of high-resistivity (Cr doped) GaAs and the GaAs/oxide interface by effectively monitoring the surface photoconductivity. The mechanics of the two-beam technique are discussed below. The oxides are grown using wet anodic oxidation in a solution of glycol and water based electrolyte. A band of acceptor levels centered around 1 eV above the valence band is detected for all the oxidized and unoxidized samples. The density of states at this acceptor level can be compared for the oxidized and unoxidized samples. The result shows a lower density of states for the bare GaAs as compared to the oxidized GaAs. The samples oxidized at different current densities are compared, and those oxidized at lower current densities show a lower density of interface states. High-resistivity of GaAs is studied because of the greater sensitivity of the TAV signal for higher resistivities of the semiconductors ($\rho > 0.1$ Ωcm). The results for the high-resistivity GaAs should be applicable to low-resistivity samples due to the intrinsic nature of the interface states. Furthermore, improved means for controlling oxidization rate of anodically oxidized GaAs samples are disclosed.

In one embodiment of the present invention high-resistivity ($\rho > 10^7$ Ωcm), Cr doped, <110>, GaAs samples were used, polished at one surface. These samples were oxidized at 0.1, 1, and 3 mA/cm$^2$ constant current densities. Such oxidation was performed in a 3% aqueous solution of tartaric acid, buffered by NH$_4$OH to pH=5 and then mixed with propylene glycol at a 1:2 ratio.

In the practice of the invention, all the samples are preferred oxidized until the voltage drop between the counter electrode and the GaAs reaches the value of 50 V, and then the current source is disconnected. The voltage drop versus time curves are straight lines for 1 and 3 mA/cm$^2$ with a very short period of nucleation phase. At current density of 0.1 mA/cm$^2$ the nucleation phase is longer ($\simeq 360$ s). The oxides are grown under constant electric field condition. The film formation rate is about $10^{-4}$ cm/C considering the oxide electric field to be $5 \times 10^6$ V/cm. The average value of the oxide thickness per voltage drop across the oxide is 20 A/V. The oxidation process is performed while the samples are illuminated as described below. Prior to oxidation the samples are cleaned with Trichloroethylene, acetone and DI water. The native oxide is removed by HCl and rinsed in methanol.

Studying the interface properties of the unoxidized GaAs and oxidized GaAs using two-beam spectroscopy of TAV relies on the interaction of the electric field which accompanies a surface acoustic wave propagating on a piezoelectric substrate, with the carriers of the semiconductor placed near the substrate. The surface acoustic wave is generated and detected by interdigital transducers. The transducer at one end of the substrate is excited by an rf pulse (rf frequency=110 MHz, pulse length=10 ms). This excitation generates a wave which propagates along the piezoelectric substrate (y-cut, z-propagating Lithium-Niobate). This mechanical wave is accompanied by an electric field which exists both inside and outside the Lithium-Niobate. On the outside its amplitude decays exponentially with distance from the surface. The decay constant is on the order of the acoustic wavelength ($\lambda \simeq 31.6\mu$). Placing a semiconductor near the surface of the piezoelectric material causes the propagating electric field to interact with the free carriers at the surface of the semiconductor, the transverse component of which can be detected by placing a metal plate above the semiconductor and one below the substrate. This voltage is the transverse acoustoelectric voltage.

The amplitude of the TAV depends on the conductivity near the surface of the GaAs and the interface of GaAs/oxide. The TAV is monitored while illuminating the sample with monochromatic light, measuring the effective surface photoconductivity. In the case of the two-beam spectroscopy, the wavelength of one beam is fixed (bias light, 750 nm−1.65 eV, photon flux=$7 \times 10^4$/cm$^2$s), while the wavelength of the second beam (secondary light) varies between 500-2000 nm. The photo flux of the secondary light is kept constant by adjusting the input aperture of the monochromator (photon flux equal to $7 \times 10^{14}$/cm$^2$s for low-power spectroscopy and $2.8 \times 10^{15}$/cm$^2$s for high-power spectroscopy).

Figure 2A:
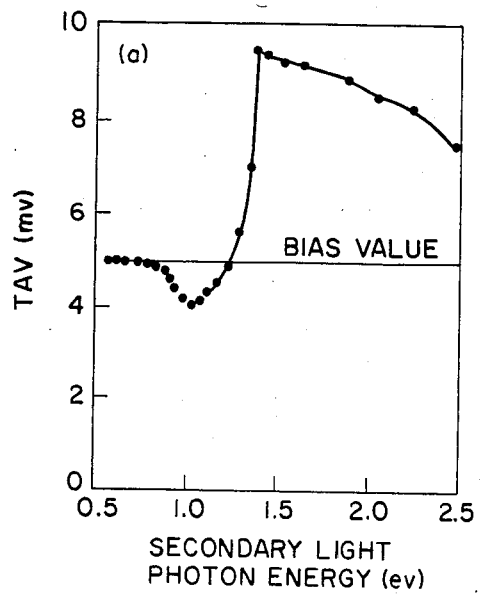
FIG. 2 shows low-power two-beam TAV spectra for the oxidized and unoxidized GaAs samples, with bias light photon flux equal to $7 \times 10^{14}/cm^2s$ and bias light photon energy equal to 1.65 eV. The secondary light photon flux equal to $7 \times 10^{14}/cm^2s$ with secondary light photon energy circa 0.6–2.5 eV. (a) The unoxidized GaAs; (b) The GaAs oxidized at 0.1 mA/cm²; (c) The GaAs oxidized at 1 mA/cm²; and (d) The GaAs oxidized at 3 mA/cm².
Figure 2B:
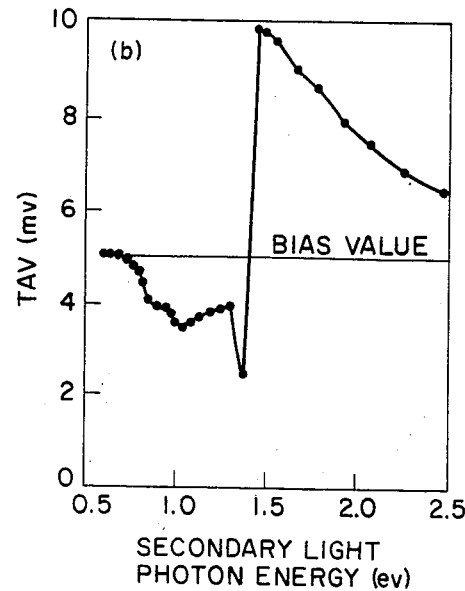
Figure 2C:
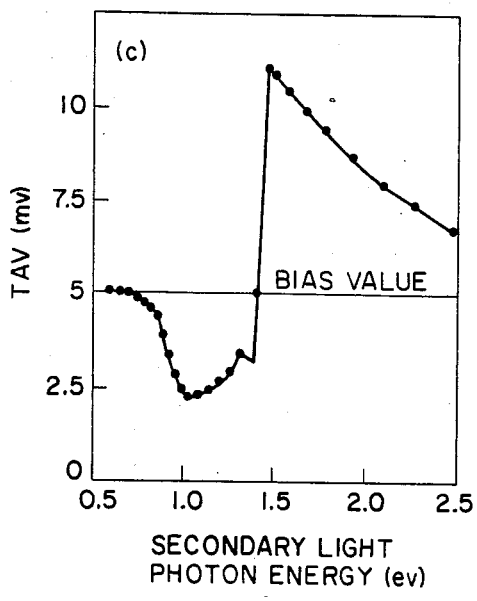
Figure 2D:
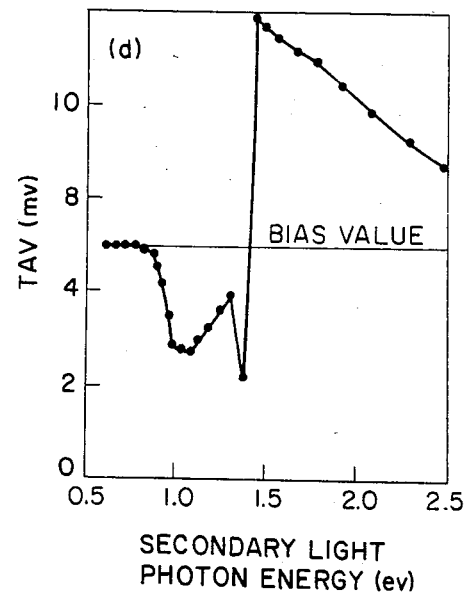
Figure 3:
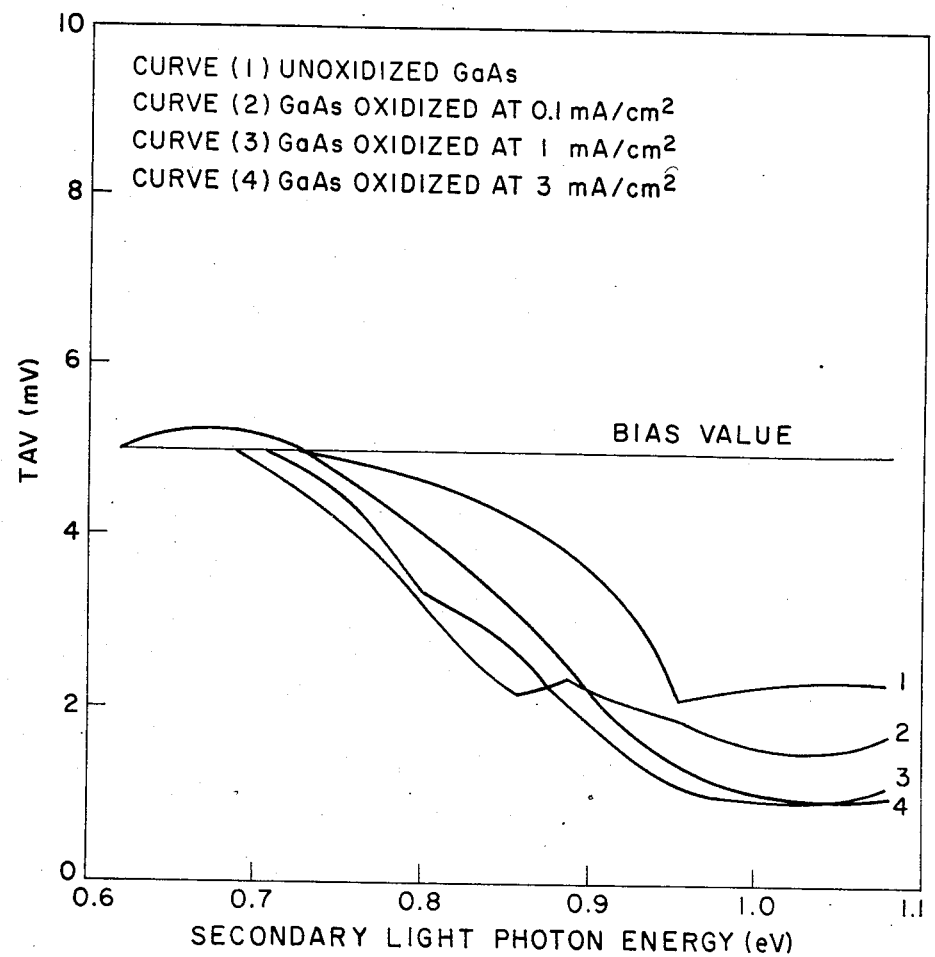
FIG. 3 shows high-power two-beam TAV spectrum of the unoxidized and oxidized GaAs samples, with bias light photon flux equal to $7 \times 10^{14}/cm^2sec$ and the bias light photon energy equal to 1.65 eV. The secondary light photon flux equal to $7 \times 10^{14}/cm^2sec$ with the secondary light photon energy circa 0.6–1.1 eV.

The results of the TAV spectroscopy is shown in FIGS. 1-3. FIG. 1 shows the one-beam spectroscopy of the unoxidized GaAs sample. In this figure, after the drop of the TAV under the sub-bandgap radiation (Photos energy<1.4 eV), a peak can be observed around 0.87 eV (1400 nm). This peak is much smaller than the bandgap peak ($\simeq 1/10$). No other peak can be observed in this spectrum. In FIG. 3(a) the low-power (secondary photon flux equal to $7 \times 10^{14}$/cm$^2$ sec) two-beam spectrum of the same sample is presented. A minimum around 1.05 eV can be observed. This minimum could not be detected using the one-beam spectroscopy (FIG. 1). It should be noted that the amplitude of the TAV is smaller than the bias light value at this minimum. FIGS. 2(b), 2(c), and 2(d) present the low-power two-beam spectra of the samples, oxidized at 0.1, 1, and 3 mA/cm$^2$, respectively (secondary light photon energy at 0.6-2.5 eV). In these spectra a stronger minimum around 1 eV can be observed. A relative maximum around 1.25 eV is also present.

FIG. 3 shows the high-power two-beam spectrum of all the samples for photon energies of 0.6-1.1 eV. The photon flux of the secondary light is increased by a factor of four in order to reveal the sub-bandgap structure of the interface more clearly (photon flux equal to $2.8 \times 10^{15}$/cm$^2$sec) In this figure, curve 1 is the spectrum of the unoxidized GaAs and curves 2, 3, and 4 correspond to the samples oxidized at 0.1, 1, and 3 mA/cm$^2$, respectively. The broad minimum around the 1 eV can be observed for all the samples. The minima corresponding to the oxidized samples are stronger than the unoxidized sample. The sample oxidized at higher current densities (1 and 3 mA/cm$^2$) shows a stronger minima as compared to the one oxidized at low-current density (0.1 mA/cm$^2$). The GaAs oxidized at 3 mA/cm$^2$ exhibits an additional peak around 0.68 eV. The amplitude of the TAV at this maximum is larger than the bias value. This peak cannot be observed in the spectra of the other samples.

Figure 4:
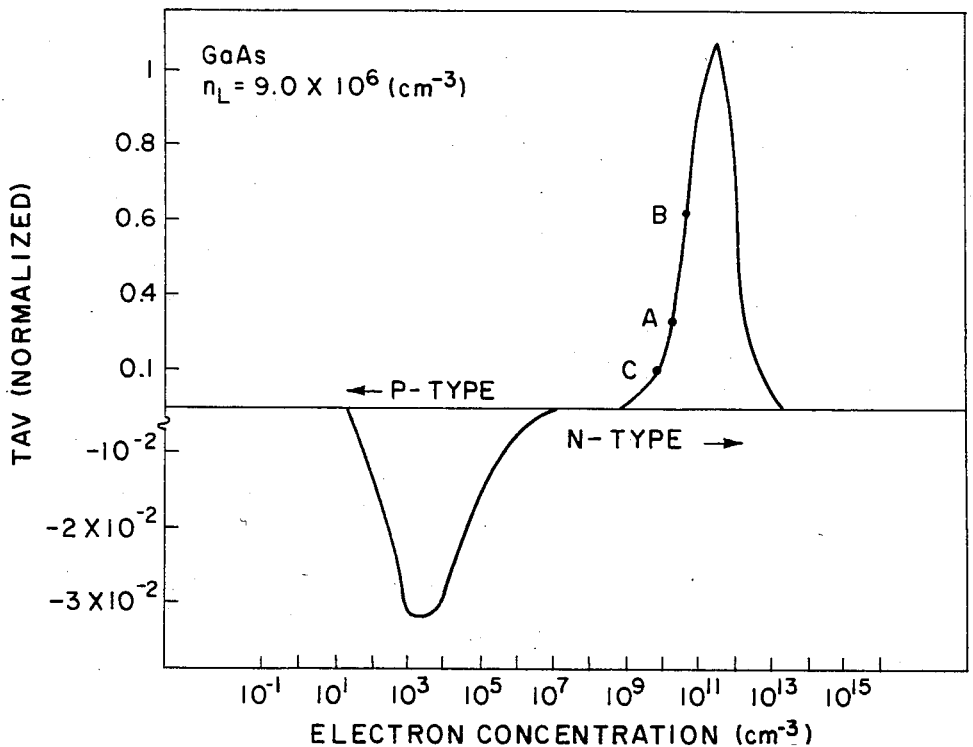
FIG. 4 shows transverse acoustoelectric voltage as a function of carrier concentration in GaAs.

For high-resistivity GaAs the amplitude of the TAV is proportional to ($n\mu_n - p\mu_p$), where n,p are the free electron and hole concentrations at the surface, respectively, and $\mu_n, \mu_p$ are the electron and hole mobilities, respectively. The theoretical plot of the TAV versus conductivity is shown in FIG. 4. The difference between electron and hole surface photoconductivities is monitored by the TAV to characterize the semiconductor interface.

The interface states are generally in one of the following forms:

(A) Acceptor levels in the p or n semiconductor:
(A-1) level below the $E_f$ at dark,
(A-2) level above the $E_f$ at dark;
(B) Donor levels in the p or n semiconductor:
(B-1) level below the $E_f$ at dark,
(B-2) level above the $E_f$ at dark.

Figure 5A:
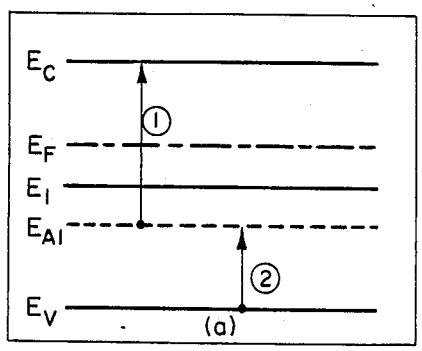
FIG. 5 shows transitions associated with a band of acceptor levels within the bandgap of an n-type semiconductor. (a) The acceptor level ($E_{A1}$) below the fermi energy; (b) The acceptor level ($E_{A2}$) above the fermi energy; and (c) The interface band structure of the GaAs and the GaAs/oxide interface.

For the case A-1, most of the interface states ($E_{A1}$) are filled up in the dark [FIG. 5(a)] and the sample is n type (point A in FIG. 4). In this case the transition (1) is the electron transfer from the acceptor level to the conduction band and transition (2) from the valence band to the acceptor level. Using one-beam spectroscopy, the incident beam of energy ($E_C - E_{A1}$) increases the TAV slightly by enhancing by transition (1). The amount of increase is determined by the transition probability and the number of carriers available at $E_{A1}$. Incident beams of energy ($E_{A1}-E_V$) do not change the TAV appreciably because the $E_{A1}$ levels are mostly full. In the event of any effect the TAV should be smaller than dark value (point C in FIG. 4).

Using the two-beam spectroscopy in this case, the incident bias light with energies greater than or equal to the bandgap, has the following effects. (1) Due to the band to band transition more carriers are generated and the TAV amplitude increases (the mobility of electrons is greater than holes, which causes a net increase in TAV amplitude, point B in FIG. 4). (2) By exciting the electrons from $E_{A1}$ level to EC, these levels become ready to accept electrons from the valence band, upon shining the secondary light with the ($E_{A1}-E_V$) energy. This effect should cause a detectable decrease of the TAV below the bias light value which determines the position of the acceptor level. For the cases where the energy ($E_{A1}-E_V$) does not excite any other opposing transition, this is a very strong tool to detect the presence and the position of the acceptor levels below the fermi energy.

Figure 5B:
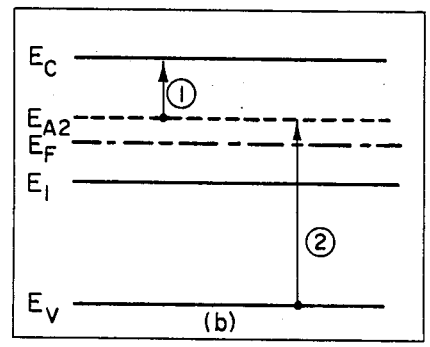

The acceptor levels above the fermi energy [$E_{A2}$ in FIG. 5(b)] are mostly empty at the dark condition. The incident beam of energy ($E_C-E_{A2}$) does not have a strong effect on the TAV due to the low number of available electrons at the $E_{A2}$ level (transition "1"). The electron transfer to $E_{A2}$ (transition "2") should quench the TAV amplitude by increasing the hole conductivity. Due to the small dark value of TAV for high-resistivity GaAs, the quenching effect of transition "2" is very weak and undetectable (unless a surface inversion is possible). The two beam radiation in this case causes a large TAV by the bias light, and the secondary incident beam with energy ($E_{A2}-E_V$) decreases the TAV amplitude below the bias light value. The quenching effect of transition "2" can be easily detected in this condition. The effect of the transitions "1" and "2" [FIG. 5(a),(b)] on the TAV amplitude is directly proportional to the density of the states of the acceptor level. For the semiconductors exhibiting the same interface states, the density of these states can be compared by the comparison of the TAV spectra. The capture cross-section of the interface states can be measured by interrupting the secondary light and evaluating the time constant required for the TAV to vary from the two-beam equilibrium value to the bias light value.

The above TAV data was presented in an article by the inventors, appearing at J. Appl. Phys., Vol. 53, No. 5, May 1982, and was analyzed therein as follows:

(1) The weak maximum around the 0.87 eV at the unoxidized sample spectrum (FIG. 1), is believed to be due to the Cr level. This state is an acceptor level, located at 0.87 eV below the conduction band [FIG. 5(c)]. The transition of the electrons from the Cr level to the conduction band increases the TAV slightly (transition "3"). Transition "4" cannot be detected and except for the TAV drop at the sub-bandgap radiation no other structure is observed in this spectrum.

Figure 5C:
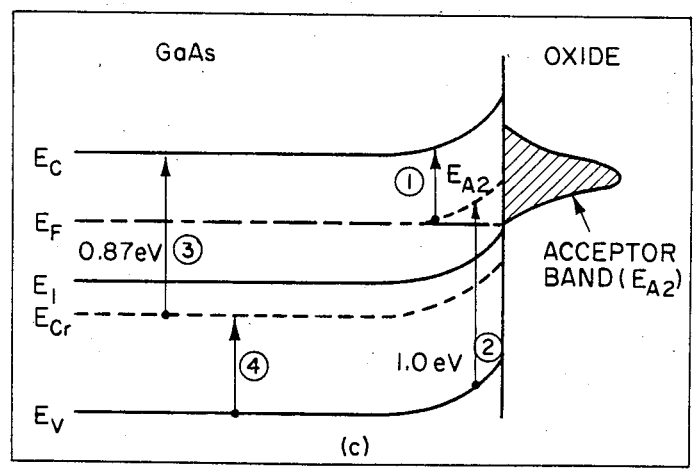

(2) The broad minimum around the 1 eV radiation for the two-beam spectroscopy of the same sample [FIG. 2(a)] can be due to an acceptor band, centered around 1 eV above the valence band [level $E_{A2}$ in FIG. 5(c)]. The excitation of electrons from the valence band to this acceptor band (transition "2") decreases the TAV amplitude below the bias light value. It should be noted that this minimum is not detectable in the one-beam spectrum.

(3) FIGS. 2(b), (c) and (d) show the two-beam spectra of the GaAs samples, oxidized at 0.1, 1, and 3 mA/cm$^2$. It can be seen that the minimum around the 1 eV level is present for all the oxidized samples. This minimum is stronger than the unoxidized sample [FIG. 2(a)]. This effect is due to the oxidation process which creates a higher density of $E_{A2}$ interface states.

(4) To compare the density of states for the samples oxidized at different current densities, the high-power two-beam spectroscopy is performed in the range 0.6-1.1 eV. The result is shown in FIG. 3. The comparison of the spectra clearly reveals the increase of the interface state density for the samples oxidized at higher current density. Curve "2" corresponds to the sample oxidized at 0.1 mA/cm$^2$ which shows a minimum level, stronger than the unoxidized sample (curve "1") but weaker than the samples oxidized at 1 mA/cm$^2$ (curve "3") and 3 mA/cm (curve "4"). Curve "4" exhibits a peak at the photon energy of ≃0.67 eV. This peak (above the bias light value) is due to the transition of the electrons from the $E_{A2}$ band to the conduction band (transition "1"). The effect of this transition can be observed only when the interface states density at the $E_{A2}$ band is high enough to induce a detectable change in the TAV signal. It should be noted that in most conditions the position of the peaks are shifted toward the higher energies. This effect can be due to the momentum transfer needed in addition to the energy required for the band to acceptor level transition. From the data presented, it can be concluded that: (a) a band of acceptor levels is present at 1 eV above the valence band in the unoxidized GaAs samples; (b) this acceptor band exists at the GaAs/Oxide interface with a higher density of states; and (c) the density of states increases if the sample is oxidized at higher current density.

(5) The GSCH model, described by P. E. Gregory, et al, 13 Sci. Technol. 234 (1976), and the theoretical work by Panday, described by Panday, et ano, 15 Sci. Technol. 440 (1978), can be used to delineate the acceptor band at the bare GaAs surface. According to these works the empty and filled surface states are associated with the columns III and V atoms, respectively. The $E_{A2}$ acceptor band can be attributed to the Ga- empty orbitals at the unoxidized GaAs surface, suggesting the intrinsic nature of these states. The anodic oxidation increases the density of states by forming a thin layer of disordered, nonstochrometric and amorphous interface layer. The oxide/GaAs interface forms with the nucleation of $Ga_2O_3$ at the GaAs surface. The structure of the $Ga_2O_3$ layer is dependent on the current density. At the current densities higher than 1 mA/cm$^2$ the crystalline $\beta$-$Ga_2O_3$ forms at the interface, which can increase the density of the interface states. It should be noted that the oxide bulk properties can be improved by the application of higher current density during the oxidation. The reason is that the $As_2O_3$ forms and becomes a part of the oxide before leaching out. The carrier exchange between the interface states and the semiconductor by tunneling can be responsible for the long time constant involved (on the order of five minutes) in the transition "1" [FIG. 5(c)]. This time constant is measured by interrupting the secondary light while monitoring the TAV change between equilibrium values. The relative maximum observed around 1.25 eV in FIGS. 2(b), (c) and (d) can be due to a donor band above the valence band.

Anodic oxidation of semiconductors has been used successfully to grow a good quality oxide on semiconductor surfaces having better characteristics than thermally grown oxides. The presently disclosed new means of growing a selective oxide is very useful in fabrication processes due to the elimination of the oxide etching step. More particularly, the oxide can be grown in the form of the desired pattern during the growing process.

Figure 6:
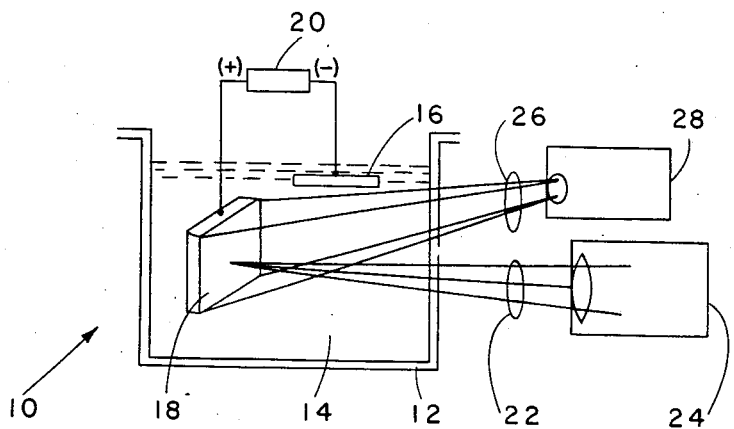
FIG. 6 is a partial sectional, partial block diagram of a preferred embodiment of the present invention.

An embodiment of the invention for carrying out such process is shown in FIG. 6. The apparatus 10 comprises a non-conductive container 12 for containing electrolyte 14, counter electrode 16 and semiconductor 18. The actual electrolytic process is driven by electrical driver unit 20, where the negative side of driver 20 is coupled to electrode 16 and the positive side of driver 20 is coupled to semiconductor 18, and where this circuit is completed via electrolyte 14.

The process of oxidation is controlled by selective application of a writing beam 22, produced by first source 24, and a bias beam 26, produced by second source 28. The writing beam 22 is characterized such that anodic oxidation occurs at the surface of semiconductor 18 under influence of the writing beam 22, while oxide growth is retarded at those points where only bias beam 26 is projected. Hence, the spectrum of the writing beam is one which accelerates oxide growth, even in the presence of the bias beam, although the spectrum of the bias beam is one which retards oxide growth.

For the writing beam 22, the ideal wavelength will be found empirically for the given type of semiconductor under test in order to achieve a high oxide growth rate. For this purpose, a laser light or a monochromatic light or a filtered white light with a bandpass filter can be used, and should be projected only upon such surface sought to be oxidized. In a similar manner, bias beam 26 will be determined for best oxide growth retardation for the materials under test.

Semiconductor 18 can comprise any semiconductor material where a suitable electrolyte can be found for oxidation thereof, although GaAs is preferred. The electrolyte 14 should be selected to allow anodic oxidation to occur only at the point or points where the writing beam 22 shines on the sample. The right choice of electrolyte is critical because if oxidation takes place in the dark, then the surface of the sample will be oxidized even at points where no oxide should be grown. In any event, after the best electrolyte available for the materials under test has been found, then bias beam 26 of a suitable retarding wavelength will be projected onto the semiconductor surface to effectively stop or appreciably retard oxide growth. This bias beam should be shined on the entire surface of the sample being oxidized and will comprise a wavelength which retards oxide growth for the materials under test as empirically determined.

In one embodiment, oxidized samples comprise n-type GaAs, Te doped, $N_d \approx 8 \times 10^{16}$ cm$^{-3}$, $<100>$ surface. The oxidation is performed in a 3% aqueous solution of tartaric acid, buffered by NH$_4$OH to a pH of 5 and then mixed with propylene glycol in a 1:2 ratio.

A voltage controlled current source 20 is used to adjust the oxidation current density. The cell is completed by a counter electrode 16, such as a platinum plate, and the cell voltage is measured across the GaAs and Pt electrodes. For more precise measurements, a reference electrode can be used to measure the potential difference between the electrolyte and the semiconductor. The native oxide on the samples is removed by HCl prior to the oxidation. The average value of the oxide thickness per voltage drop across the oxide is about 20 A/V.

In order to monitor oxide growth during the process the current passing through the circuit can be monitored, since current falls off when oxide thickness increases. To obtain a very uniform oxide with a certain thickness the curve for current versus oxide thickness should be obtained precisely, by experimentation. The final value of the current should be kept the same for all the oxidized points for uniform growth.

Figure 7:
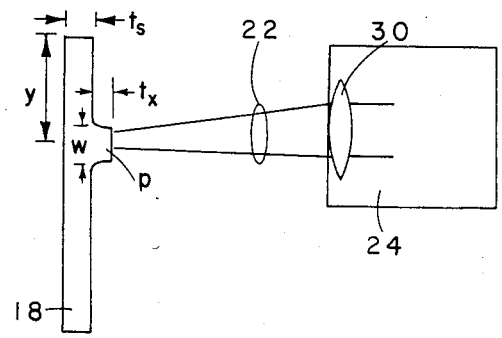
FIG. 7 is a side view of a pattern-oxidized sample in practice of the invention.

FIG. 7 is a side view of a pattern-oxidized sample in practice of the present invention. The writing beam 22 is projected at point P at a distance Y from the top of the sample, where $t_s$ is the sample thickness prior to oxidation and $t_x$ is the pattern growth depth. The resolution W of the oxide pattern depends on the focussing apparatus 30 of the writing beam source 24. Another factor affecting resolution is the amount of oxidation occurring on the sample surface adjacent to illuminated points due to diffusion of carriers from the illuminated points to the adjacent dark area. Hence, the conductivity of the oxide should be low to improve resolution.

Figure 8:
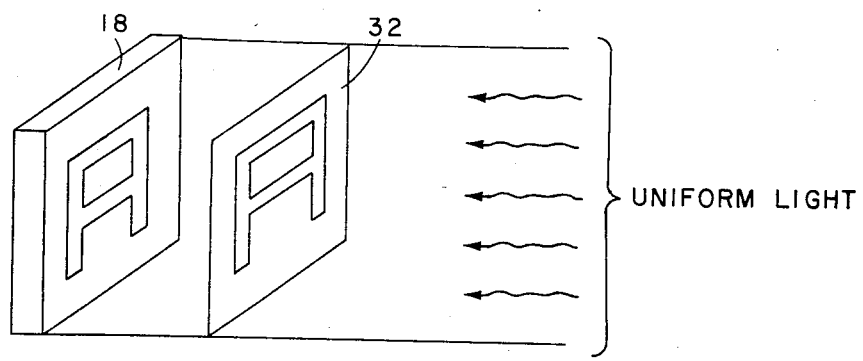
FIG. 8 shows an alternative embodiment of the invention.

In an alternative embodiment shown in FIG. 8, a mask 32 can be used, instead of writing beam 22 and focussing apparatus 30, to produce a desired pattern of oxide growth on the surface of semiconductor 18. In this case, a uniform light source at a predetermined wavelength should be employed to illuminate sample 18 through mask 32. The bias beam can also be used in conjunction with use of the mask for retardation of oxide growth.

As a further alternative embodiment, the writing beam may be shined over the entire working surface of the semiconductor sample, whereupon the bias beam is projected only onto those areas where oxide growth is sought to be retarded, and while the present invention has been described in connection with rather specific embodiments thereof, it will be understood that many other modifications and variations will be readily apparent to those of ordinary skill in the art. Hence, this application is intended to cover any adaptation or variation thereof. Therefore, it is manifestly intended that this invention be only limited by the claims and the equivalents thereof.

What is claimed is:

1. A method of growing an oxide pattern on the working surface of a semiconductor sample, comprising the steps of:

maintaining said semiconductor sample in an electrolyte solution;

illuminating said working surface of said semiconductor sample with a writing beam which is selected at a wavelength which accelerates oxide growth on said working surface of said semiconductor sample;

selectively illuminating a portion of said working surface of said semiconductor sample with a bias beam which is selected at a wavelength which retards growth on said working surface of said working surface of said semiconductor sample; and selecting said electrolyte solution such that anodic oxidation occurs on said working surface of said semiconductor sample only where said writing beam illuminates said working surface of said semiconductor sample.

2. The method of claim 1 wherein said electrolyte solution is a 3% aqueous solution of tartaric acid, buffered by NH$_4$OH to PH=5 and mixed with propylene glycol at a ratio of 1:2.

3. The method of claim 1, wherein said writing beam and said bias beam each comprise a separate beam of monochomatic light.

4. The method of claim 1, wherein said writing beam comprises collimated white light.

5. The method of claim 1 wherein said semiconductor sample comprises an n-type GaAs, Te doped, $Nd \simeq 8 \times 10^{16}$ cm$^{-3}$, <100> surface semiconductor.

6. The method of claim 1 further comprising the step of monitoring the current passing through the semiconductor sample during oxidation.

7. The method of claim 1 wherein said writing beam is created by means of a mask.

8. The method of claim 1 wherein said bias beam is created by means of a mask.

9. An apparatus for selective anodic oxidation of a working surface of a semiconductor sample for pattern generation, comprising:

means for supporting said sample in an electrolyte solution;

illuminating said working surface of said semiconductor sample with a writing beam which is selected at a wavelength which accelerates oxide growth on said working surface of said semiconductor sample;

means for selectively illuminating a portion of said working surface of said semiconductor sample with a bias beam which is selected at a wavelength which retards growth on said working surface of said semiconductor sample; and said electrolyte solution being such that anodic oxidation occurs on said working surface of said semiconductor sample only where said writing beam illuminates said working surface of said semiconductor sample.

10. The apparatus of claim 9, wherein said bias beam and said writing beam are each monochromatic.

11. The apparatus of claim 9, wherein said writing beam comprises collumated white light.

12. The apparatus of claim 9, wherein said source for projecting a writing beam comprises a mask and a source of uniform light.

13. The apparatus of claim 9 wherein said electrolyte solution is made up of 3% aqueous solution of tartaric acid, buffered by NH$_4$OH to PH=5 and mixed with propylene glycol at a ratio of 1:2.

14. The apparatus of claim 13, wherein said sample comprises:

a n-type GaAs Te doped $Nd \simeq 8 \times 10^{16}$ cm$^{-3}$, <100> surface semiconductor.

15. The apparatus of claim 14, further comprising a platinium counter electrode and a voltage controlled current source.

16. The apparatus of claim 15, wherein the average value of oxide thickness per voltage drop across the oxide is approximately 20 Å/V.

* * * * *